(12) United States Patent
Higashijima

(10) Patent No.: US 8,741,099 B2
(45) Date of Patent: Jun. 3, 2014

(54) LIQUID PROCESSING APPARATUS

(75) Inventor: Jiro Higashijima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 245 days.

(21) Appl. No.: 13/238,241

(22) Filed: Sep. 21, 2011

(65) Prior Publication Data

US 2012/0085493 A1  Apr. 12, 2012

(30) Foreign Application Priority Data

Oct. 7, 2010  (JP) ................................. 2010-227739

(51) Int. Cl.
 *C23F 1/08* (2006.01)
(52) U.S. Cl.
 USPC ................... 156/345.55; 156/345.23
(58) Field of Classification Search
 USPC ........................ 156/345.55, 345.23
 See application file for complete search history.

(56) References Cited

U.S. PATENT DOCUMENTS

| 7,431,038 | B2* | 10/2008 | Nishikido | 134/95.1 |
| 7,998,308 | B2* | 8/2011 | Kaneko et al. | 156/345.55 |
| 2009/0038641 | A1* | 2/2009 | Matsumoto | 134/6 |
| 2012/0085493 | A1* | 4/2012 | Higashijima | 156/345.23 |

FOREIGN PATENT DOCUMENTS

| JP | 09-270413 A | 10/1997 |
| JP | 2010-021279 A | 1/2010 |
| JP | 2010-028059 A | 2/2010 |

* cited by examiner

*Primary Examiner* — Sylvia R MacArthur
(74) *Attorney, Agent, or Firm* — Abelman, Frayne & Schwab

(57) ABSTRACT

Disclosed is a liquid processing apparatus that includes: a rotational unit configured to rotate a substrate to be processed while the substrate is being held horizontally; and a processing liquid supplying unit configured to supply a processing liquid to the bottom surface of the substrate to be processed which is rotating. The rotational unit includes an enclosing member surrounding the periphery of the substrate to be processed, the enclosing member includes a plurality of guide grooves formed on the bottom surface of the enclosing member and configured to guide the processing liquid, and each of the plurality of guide grooves elongates outwardly from the inner periphery and is arranged in the circumferential direction of the enclosing member.

8 Claims, 9 Drawing Sheets

LIQUID PROCESSING APPARATUS

CROSS-REFERENCE TO RELATED APPLICATIONS

This application is based on and claims priority from Japanese Patent Application No. 2010-227739, filed on Oct. 7, 2010, with the Japanese Patent Office, the disclosure of which is incorporated herein in its entirety by reference.

TECHNICAL FIELD

The present disclosure relates to a technology that performs liquid processing by supplying a processing liquid to the bottom surface of a substrate to be processed.

BACKGROUND

For example, in a manufacturing process of a semiconductor device, there is single wafer type liquid processing of rotatably holding a semiconductor wafer (hereinafter, referred to as a "wafer") which is a substrate to be processed around a vertical shaft and supplying various chemical liquids (processing liquids) onto a target surface while rotating the wafer. A wafer completed with a liquid processing is subjected to a rinse cleaning for removing the chemical liquids by supplying a rinse liquid such as deionized water (DIW) to the surface of the wafer to be processed or a drying processing for removing the rinse liquid from the wafer while continuously rotating the wafer.

A liquid processing apparatus performing the single wafer type liquid processing supplies a corrosive chemical liquid such as hydrofluoric acid to the bottom surface of the rotating wafer which is an opposite surface to a circuit forming surface of the wafer to remove an undesired film formed on the bottom surface. In this type of liquid processing apparatus, there is a phenomenon in which the chemical liquid dispersed to the entire bottom goes around and flows onto the top surface of the wafer by the action of surface tension of the liquid. When the chemical liquid goes around and reaches to the circuit forming surface of the wafer, a semiconductor device formed on the circuit forming surface may be damaged.

Accordingly, Japanese Patent Application Laid-Open No. 2010-28059 discloses a liquid processing apparatus that can prevent the chemical liquid from going around and flowing onto the circuit forming surface by installing a supporting unit that supports the wafer in a rotating cup guiding the chemical liquid dispersed from the wafer to a discharge mechanism, and by placing the rotating cup at a location close to the wafer. See, for example, claim 1, paragraphs [0020]-[0022] along with FIGS. 1 to 4 of Japanese Patent Application Laid-Open No. 2010-28059. The inventor of the present disclosure has carried out a study in order to further reduce the amount of the liquid that goes around and flows onto the top surface.

SUMMARY

An exemplary embodiment according to the present disclosure provides a liquid processing apparatus which includes a rotational unit configured to rotate a substrate to be processed while the substrate is being held horizontally; and a processing liquid supplying unit configured to supply a processing liquid to the bottom surface of the substrate to be processed which is rotating without supplying a processing liquid to the top surface thereof. In particular, the rotational unit includes an enclosing member surrounding the periphery of the substrate to be processed, the enclosing member includes a plurality of guide grooves formed on the bottom surface thereof and configured to draw out the processing liquid being entered into a gap between the substrate to be processed and the enclosing member outwardly by a capillary action to prevent the processing liquid from going around and flowing onto the top surface of the substrate to be processed, and each of the plurality of guide grooves is configured to elongate outwardly from the inner periphery and is arranged with a gap from each other in the circumferential direction of the enclosing member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
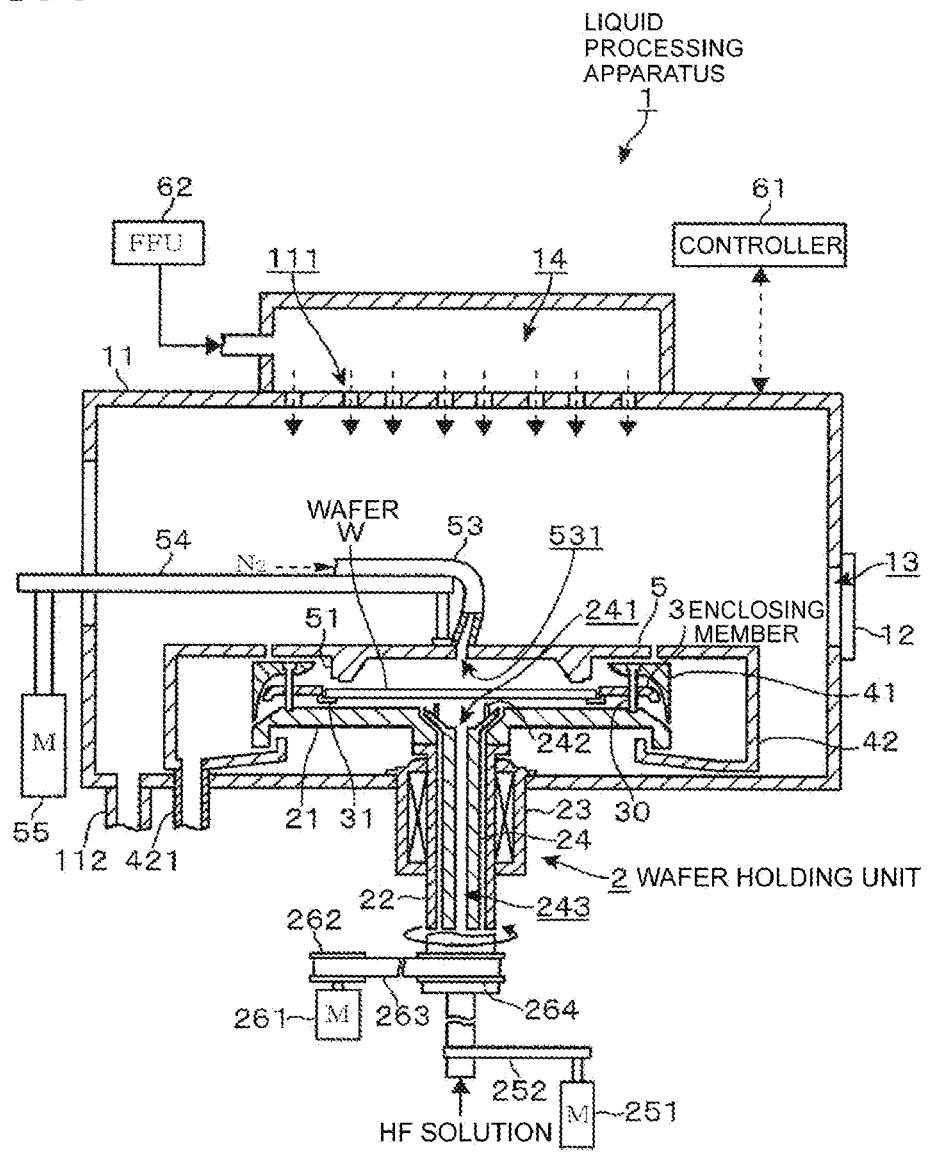
FIG. 1 is a longitudinal cross-sectional side view illustrating a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a liquid processing apparatus that can effectively prevent a processing liquid supplied to the bottom surface of a rotating substrate to be processed from going around and flowing onto the top surface.

An exemplary embodiment according to the present disclosure provides a liquid processing apparatus which includes a rotational unit configured to rotate a substrate to be processed while the substrate is being held horizontally; and a processing liquid supplying unit configured to supply a processing liquid to the bottom surface of the substrate to be processed which is rotating without supplying a processing liquid to the top surface thereof. In particular, the rotational unit includes an enclosing member surrounding the periphery of the substrate to be processed, the enclosing member includes a plurality of guide grooves formed on the bottom surface thereof and configured to draw out the processing liquid being entered into a gap between the substrate to be processed and the enclosing member outwardly by a capillary action to prevent the processing liquid from going around and flowing onto the top surface of the substrate to be processed, and each of the plurality of guide grooves is configured to elongate outwardly from the inner periphery and is arranged with a gap from each other in the circumferential direction of the enclosing member.

The plurality of guide grooves draw out the processing liquid that reaches the periphery of the substrate to be processed by a capillary action to prevent the processing liquid from going around and flowing onto the top surface of the substrate to be processed.

In the rotational unit, a plurality of holding elements are formed with a gap from each other in the circumferential direction of the substrate to be processed to hold the periphery of the substrate to be processed from the bottom surface thereof.

The plurality of holding elements are formed in the enclosing member.

A width dimension of each guide groove in the circumferential direction of the enclosing member is in the range of 0.1 mm to 5 mm A gap between the adjacent guide grooves is in the range of 0.5 mm to 10 mm Another exemplary embodiment according to the present disclosure provides a liquid processing apparatus which comprises a rotational unit configured to rotate a substrate to be processed while the substrate is being held horizontally; and a processing liquid supplying unit configured to supply a processing liquid to the bottom surface of the substrate to be processed which is rotating. In particular, the rotational unit includes a plurality of holding elements installed with a gap from each other in the circumferential direction of the periphery of the substrate to be processed and holding the substrate to be processed from the bottom surface thereof, and an enclosing member configured to surround the periphery of the substrate to be processed in order to guide the processing liquid dispersed from the substrate to be processed on the bottom surface thereof. Moreover, a distance between the adjacent holding elements is in the range of 0.5 to 10 mm.

A width dimension of a holding surface of each holding unit, which holds the substrate, in the circumferential direction of the substrate to be processed is in the range of 0.1 to 3 mm.

The plurality of holding elements are formed in the enclosing member, and a plurality of guide grooves each elongating outwardly from the inner periphery on the bottom surface of the enclosing member and being arranged in the circumferential direction thereof are formed in the enclosing member.

A gas supplying unit is provided at an upper side of the center of the substrate to be processed.

According to the exemplary embodiments of the present disclosure, it is possible to acquire an excellent processing result by preventing a processing liquid from going around and flowing onto the top of a substrate to be processed.

As an exemplary embodiment of the present disclosure, a liquid processing apparatus will be described that performs liquid processing of removing an undesired film such as SiN attached to the bottom surface and a peripheral side surface of a wafer having a diameter of 300 mm which is a substrate to be processed where a semiconductor device is formed on the top surface thereof, with hydrofluoric acid (hereinafter, referred to as a hydrofluoric acid solution).

First, a configuration of a liquid processing apparatus 1 according to an exemplary embodiment of the present disclosure will be described with reference to FIGS. 1 to 4. As shown in a longitudinal cross-sectional side view of FIG. 1, liquid processing apparatus 1 includes a wafer holding unit 2 forming a part of a holding base rotatably holding a wafer W, an inner cup 41 and an outer cup 42 installed to surround the periphery of wafer W held on wafer holding unit 2 so that a chemical liquid dispersed from wafer W is received and guided toward a discharge mechanism, and a top cover 5 placed to face the top surface of wafer W held on wafer holding unit 2 and forming a space for circulating gas such as nitrogen gas or clean air supplied from the outside between top cover 5 and wafer W, all of which are placed in a case 11.

In a ceiling part of case 11, an airstream inflow unit 14 is formed that is a space into which an airstream of clean air is introduced from, for example, a fan filter unit (FFU) 62 installed outside liquid processing apparatus 1. Air which is introduced into the airstream inflow unit 14 flows into case 11 through a plurality of circulation holes 111 formed on a ceiling surface of case 11, such that a down-flow of clean air is formed in case 11 flowing toward the downside from the upside. Reference numeral 13 indicated in case 11 represents a carry-in/out port through which wafer W is carried in/out while wafer W being loaded on a pick of a wafer transporting mechanism installed outside case 11, reference numeral 12 represents a shutter that opens/closes the carry-in/out port 13, and reference numeral 112 represents an exhaust passage for exhausting an atmosphere in case 11.

Wafer holding unit 2 includes a guide plate 21 installed on the bottom surface side of wafer W held substantially horizontally to face wafer W, a cylindrical rotation shaft 22 holding the center of guide plate 21 from the bottom surface and elongating downward vertically and a lifter 24 installed to be penetratively inserted into rotation shaft 22 in a vertical direction so that a top end thereof protrudes from and be buried from an opening formed at the center of guide plate 21.

Guide plate 21 is configured as a disk-shaped member forming a tapered inclined surface by removing a corner on the top surface side of the periphery and the bottom surface side of the periphery where the inclined surface is formed protrudes downwardly.

Rotation shaft 22 is held on the bottom of case 11 through a bearing part 23 with a bearing, and the bottom thereof protrudes downwards from the bottom of case 11, and a pulley 264 is installed at a lower end thereof. Meanwhile, a rotation motor 261 is placed at a lateral position of rotation shaft 22, and a pulley 262 is installed even on the rotation shaft of rotation motor 261. In addition, a rotation mechanism of rotation shaft 22 is configured by winding a driving belt 263 around two pulleys 262 and 264, and rotation shaft 22 is rotated at a desired rotation speed by driving rotation motor 22, and as a result, guide plate 21 and wafer W held on guide plate 21 may be rotated.

An opening 241 broadened in a bowl shape is formed on the upper end of a lifter 24 penetratively inserted into rotation shaft 22, and, for example, three-line support pins 242 capable of supporting wafer W from the bottom surface thereof are installed on the inclined surface of opening 241 while lifter 24 protrudes on the top surface of guide plate 21. Meanwhile, a cylinder motor 251 is connected to the lower end of lifter 24 through an elevating plate 252, and elevating plate 252 and lifter 24 move up and down by driving cylinder motor 251, such that lifter 24 protrudes and is buried from the top surface of guide plate 21 to transport wafer W between opening 241 and an external transporting mechanism having been approached from the upper side of lifter 24.

Further, in lifter 24, a processing liquid supply passage 243 is formed to penetrate lifter 24 vertically. Processing liquid supply passage 243 is connected to a processing liquid storing unit (not shown) to supply a processing liquid such as an HF solution or deionized water (DIW) to the bottom surface of wafer W through opening 241 formed on the upper end of lifter 24. Therefore, processing liquid supply passage 243 or an HF solution storing unit and a mechanism for adjusting the flow rate of the HF solution connected thereto constitute a part of a processing liquid supplying unit for supplying the HF solution (chemical liquid), which is one type of the processing liquid, to the bottom surface of wafer W. Meanwhile, in the exemplary embodiment, the HF solution used in the liquid processing for removing an undesired film from wafer W is called the chemical liquid, and the chemical liquid and DIW used in rinse cleaning accompanied by the liquid processing are generally called the processing liquid.

Figure 2:
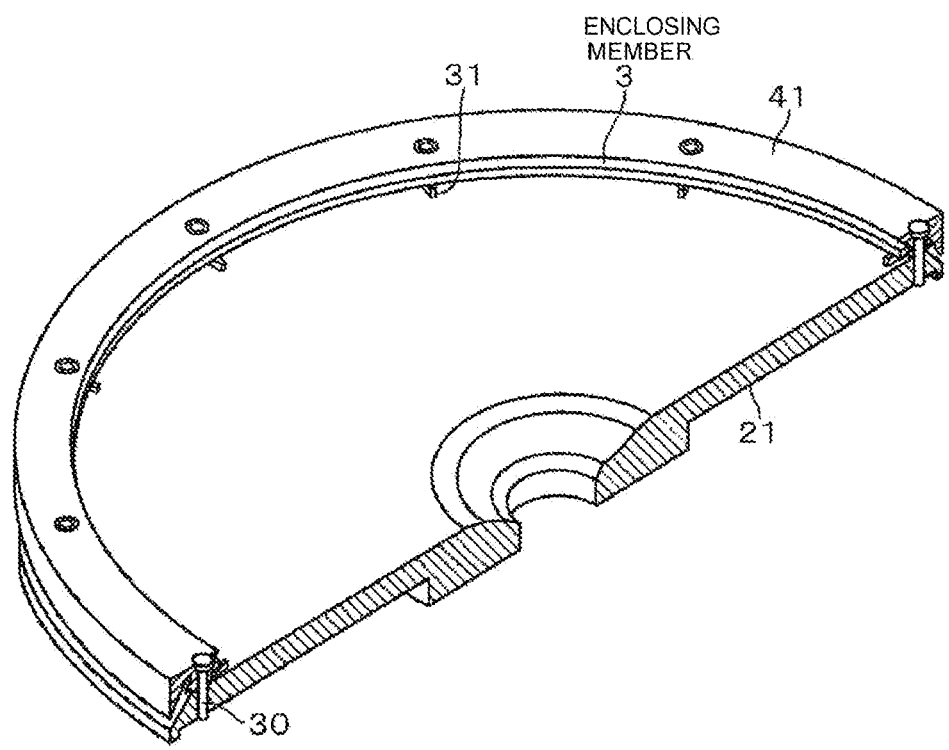
FIG. 2 is a longitudinal cross-sectional perspective view illustrating a configuration composed of a guide plate, an enclosing member, and an inner cup installed in the liquid processing apparatus.

At an upper position of the periphery of guide plate 21 constituting wafer holding portion 2, a gap is formed from the top surface of guide plate 21, such that an annular-shaped enclosing member 3 is placed to surround the periphery of wafer W. Further, at an upper position of enclosing member 3, a gap is formed from the top surface of enclosing member 3, such that annular-shaped inner cup 41 is placed. As shown in FIG. 2, enclosing member 3 and inner cup 41 are fastened and fixed to guide plate 21 with a screw 30, and rotate integrally with guide plate 21 by rotating rotation shaft 22. As seen in the above configuration, enclosing member 3 and guide plate 21 serve as parts of the rotational unit of the exemplary embodiment which rotate integrally with each other.

Figure 3:
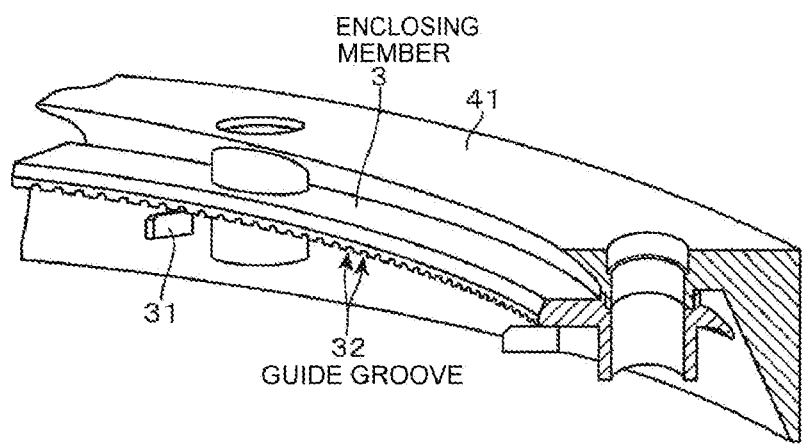
FIG. 3 is an enlarged perspective view of the enclosing member and the inner cup.
Figure 4:
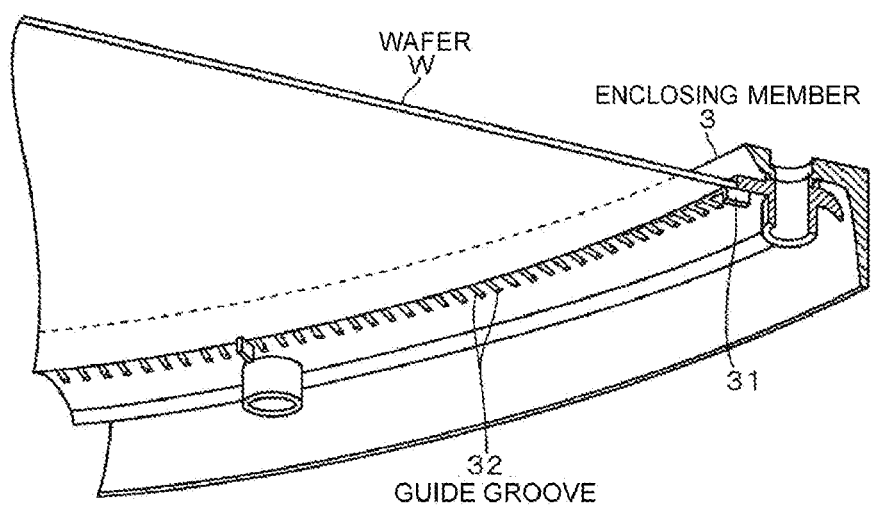
FIG. 4 is an enlarged perspective view illustrating a configuration of a guide groove formed in the enclosing member preventing a chemical liquid from going around and flowing onto the top surface.

In enclosing member 3, wafer W may be placed inside the opening. As shown in FIGS. 2 to 4, a holding unit 31 having a small piece shape that protrudes toward the diameter-direction inside from the bottom surface thereof is formed in enclosing member 3, and the in the exemplary embodiment, 12 holding elements 31 are arranged at an equal distance on the inner peripheral surface of the opening of enclosing member 3.

Figure 6:
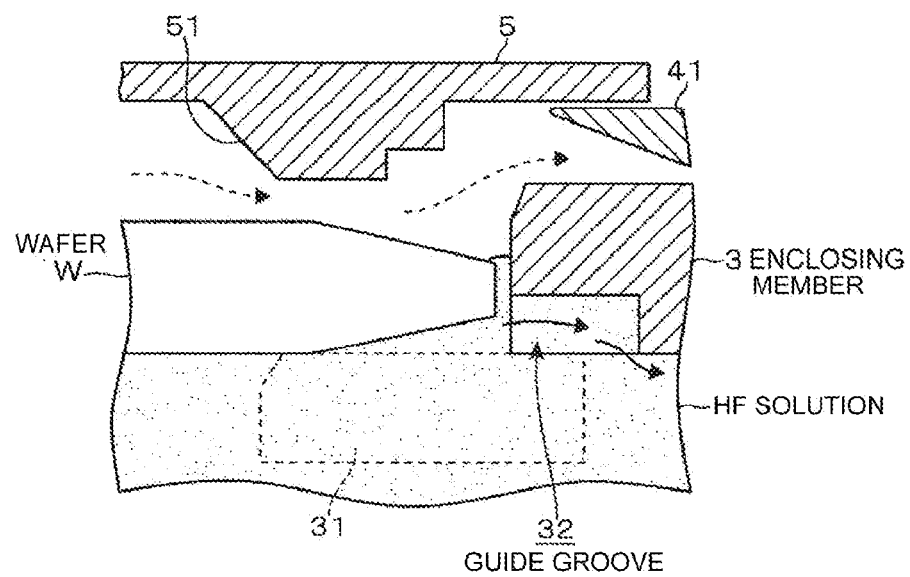
FIG. 6 is a first explanatory diagram illustrating the action of the guide groove.

The top surface of each holding unit 31 is horizontal, such that wafer W is horizontally held inside the opening by loading wafer W on the top surface of each holding unit 31 as shown in FIG. 4. In addition, when wafer W is mounted on holding unit 31, for example, a gap having a size which is larger than 0 mm and equal to or smaller than several millimeters is formed between the peripheral side surface of wafer W and the inner peripheral surface of enclosing member 3 as shown in FIG. 6. Further, a height position holding wafer W is adjusted so that a gap for dispersing each processing liquid is formed between the top surface of guide plate 21 and the bottom surface of wafer W.

Moreover, enclosing member 3 is configured as a flat plate material that elongates toward the diameter-direction outside from a position facing the peripheral side surface of wafer W. Enclosing member 3 follows the inclined surface formed on the outer periphery of guide plate 21, such that the outer periphery of enclosing member 3 is also bent downwards. In addition, as described above, since enclosing member 3 rotates integrally with guide plate 21, wafer W is held by holding unit 31 formed in enclosing member 3 to thereby rotate wafer W integrally with guide plate 21 or enclosing member 3. Enclosing member 3 also serves to guide the chemical liquid dispersed from wafer W on the bottom surface thereof.

Inner cup 41 placed above enclosing member 3 is configured as an annular-shaped member that elongates horizontally toward the diameter-direction outside to cover the top surface of enclosing member 3. The outer periphery thereof is bent downward, such that a longitudinal cross section thereof has an L shape as shown in FIGS. 3 and 4. The lower end of inner cup 41 that is bent downward elongates out up to a position above an outer peripheral end of guide plate 21 to form a gap of approximately 1 to 10 mm between inner cup 41 and guide plate 21. Meanwhile, the annular-shaped opening of inner cup 41 has a size that allows wafer W held by lifter 24 to pass through the opening vertically.

Outside of guide plate 21, enclosing member 3, and inner cup 41 that rotate integrally with each other by the action of rotation shaft 22 is placed outer cup 42 for guiding various kinds of processing liquids discharged outward from the gap between guide plate 21 and inner cup 41 to a discharge path 421. As shown in FIG. 1, a longitudinal cross section of outer cup 42 has a shape in which a rectangular pipe is bent in an annular shape and discharge path 421 connected to an external exclusion facility is formed on the bottom surface thereof.

An inclined surface is formed on the bottom surface of outer cup 42 to be lowered when going from the inner periphery toward the outer periphery and serves to guide a processing liquid discharged and dropped from the gap between guide plate 21 and inner cup 41 toward discharge path 421.

Further, as shown in FIG. 1, a side wall of the inner peripheral surface side of wafer W of outer cup 42 elongates out upwards from the bottom surface side and intersects the periphery of guide plate 21 that protrudes downwards through non-contact to prevent gas or mist of the processing liquid discharged to the inside of outer cup 42 from flowing out toward rotation shaft 22.

Herein, outer cup 42 is fixed on for example, the bottom of case 11.

Top cover 5 is a disk-shaped member that is placed above inner cup 41 to cover the opening of inner cup 41 opened toward the top surface, from the top surface side and is cantilever-supported by a support beam 54 from the top surface side. Since support beam 54 is connected to cylinder motor 55, support beam 54 covers the opening of inner cup 41 from the top surface side by driving cylinder motor 55 and may move between a processing position facing the top surface of wafer W held on wafer holding unit 2 and a retreat position moving upwards from the processing position.

Further, a gas supplying port 531 is formed at the center of top cover 5 for supplying inert gas such as nitrogen gas into a space that is formed between wafer W and top cover 5, and a gas supplying pipe 53 connected to a gas supplying source (not shown) is connected to gas supplying hole 531. Gas supplying pipe 53 corresponds to a gas supplying unit of the exemplary embodiment.

Meanwhile, an annular protrusion 51 that is formed to be inserted into the inside of the opening of inner cup 41 to protrude toward the lower side of top cover 5 is formed on the bottom surface of top cover 5. For example, two-stage step that elongate downward from the outer periphery toward the inner periphery are formed in protrusion 51. When top cover 5 moves to the processing position, the bottom surface of the two-stage step may form a little gap which is smaller than a space at the center by facing the periphery of the top surface of wafer W.

A tapered inclined surface that elongates upwards toward the inner periphery from the outer periphery is formed on the inner periphery further than a region where the two-stage step of protrusion 51 is formed so that gas supplied into the space that is formed between wafer W and top cover 5 can be guided toward the gap. Further, protrusion 51 serves to partition the space formed between wafer W and top cover 5 outside the gap in order to prevent the gas discharged between enclosing member 3 and inner cup 41 from flowing backward while including the mist of the HF solution.

Liquid processing apparatus 1 having the configuration described above includes a mechanism that prevents the chemical liquid from going around and flowing onto the top surface of wafer W as the chemical liquid is supplied to the bottom surface of wafer W from processing liquid supply passage 243. Herein, the configuration of the mechanism will be described.

As shown in FIGS. 3 and 4, as the mechanism that prevents the chemical liquid from going around and flowing onto the top surface, a plurality of guide grooves 43 that elongate outwards from the inner periphery of enclosing member 3 and are arranged radially in the circumferential direction are formed on the bottom surface of enclosing member 3. By forming guide grooves 32 that elongate outwards from the inner periphery of enclosing member 3, the chemical liquid that enters the gap between the outer peripheral surface of wafer W and the inner peripheral surface of enclosing member 3 is drawn out using a capillary action of guide grooves 32 to promote the discharge of the chemical liquid. As a result, the amount of the chemical liquid that remains in the gap is reduced to prevent the chemical liquid from going around and flowing onto the top surface of wafer W.

Figure 7:
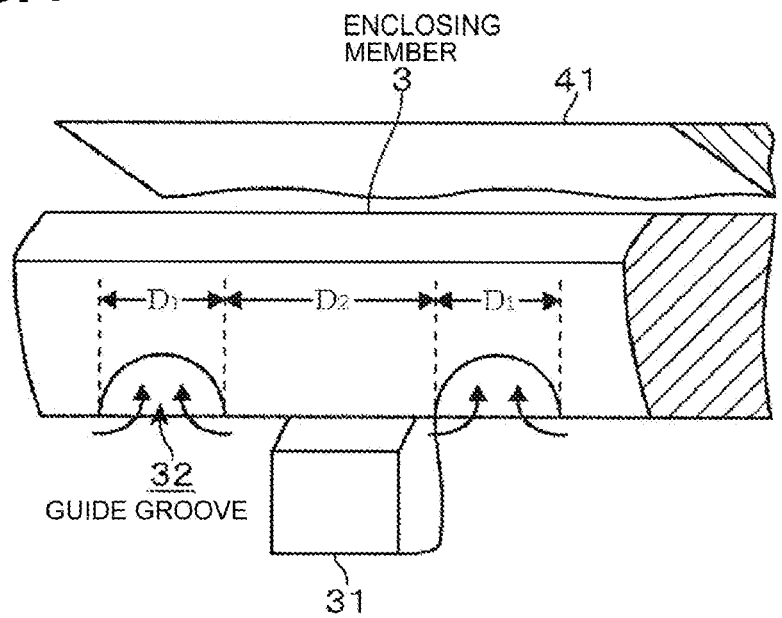
FIG. 7 is a second explanatory diagram illustrating the action of the guide groove.

In respect of exerting the capillary action for the chemical liquid, $D_1$, the width dimension of guide grooves 32 shown in the enlarged diagram of FIG. 7 is preferably in the range of 0.1 mm to 5 mm, and more preferably in the range of 1.5 mm to 3 mm. Further, even though guide grooves 32 are formed, if the number of guide grooves 32 to be placed is small, an effect of drawing out the chemical liquid cannot be sufficiently achieved. The number of guide grooves 32 varies depending on the diameter of wafer W to be processed, but for example, a gap $D_2$ between guide grooves 32 is preferably in the range of 0.5 mm to 10 mm, and more preferably in the range of 0.5 mm to 3 mm. The ranges of $D_1$ and $D_2$ show an empirical result acquired by determining an appropriate range to prevent the chemical liquid from going around and flowing onto the top surface on the basis of a result of an experiment or fluid simulation.

For example, in liquid processing apparatus 1 of the exemplary embodiment that processes wafer W having a diameter of 300 mm, when the width of the gap between the peripheral side surface of wafer W and the inner peripheral surface of enclosing member 3 is 2 mm, the length of the inner peripheral surface of enclosing member 3 is 955 mm. When 360 guide grooves 32 having the width dimension $D_1$ of 1 mm are arranged on the inner peripheral surface at an interval of 1° when viewed from the center of wafer W, gap $D_2$ between guide grooves 32 is approximately 1.65 mm. Further, the length of guide grooves 32 that elongate in the diameter direction is not particularly limited, but the lengths are preferably 1 mm or more.

Further, as shown in FIG. 1, a controller is connected to liquid processing apparatus 1. The controller includes, for example, a computer including a CPU and a storage part t (not shown). The storage part stores a computer program having a logical structuring of steps (commands) group organized for control associated with an action of liquid processing apparatus 1, that is, an operation in which wafer W is carried into liquid processing apparatus 1, liquid-processed and rinse-cleaned, and then carried out. This program is stored in a recording medium such as a hard disk, a compact disk, a magnet optical disk, and a memory card and installed in the computer therefrom.

An operation of executing the liquid processing of wafer W by liquid processing apparatus 1 having the above-mentioned configuration and an action of guide groove 32 when executing the operation will be described with reference to FIGS. 6 and 7.

In liquid processing apparatus 1, top cover 5 is retreated toward the upper side and lifter 24 is moved up to a delivery position of wafer W when wafer W is carried in. In this case, a down-flow in which clean air flows toward the bottom from the top is formed in case 11. Thereafter, shutter 12 of case 11 is opened to allow the pick of the external wafer transporting mechanism supporting wafer W to enter a height position between top cover 5 and support pins 242. Continuously, the pick and the support pin 242 are intersected with each other by moving down the pick and wafer W is delivered to lifter 24, and thereafter, the pick is retreated from the inside of case 11.

Figure 5:
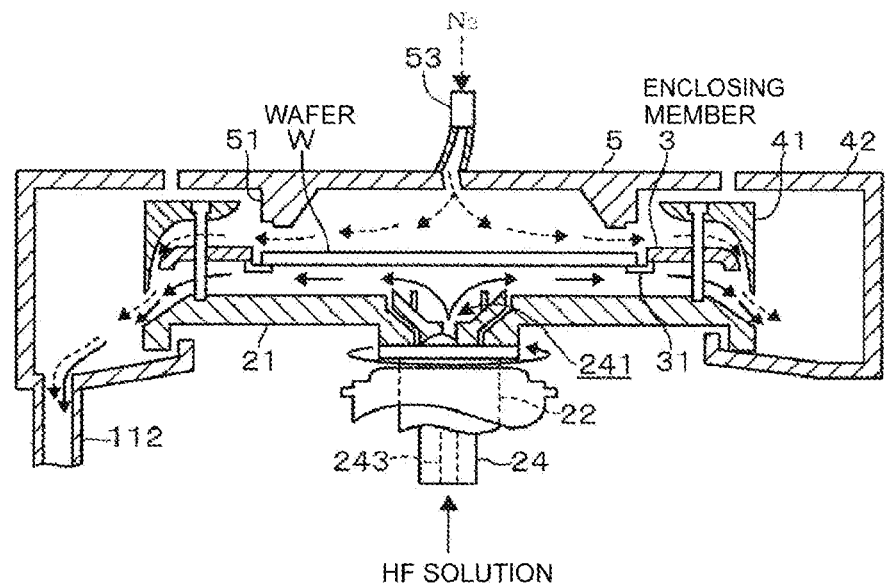
FIG. 5 is an explanatory diagram illustrating a liquid processing operation by the liquid processing apparatus.

When wafer W reaches the height at which enclosing member 3 is placed as lifter 24 moves down while supporting wafer W, wafer W is delivered to holding unit 31 from lifter 24 and to be supported on enclosing member 3. Thereafter, by moving down top cover 5, a space in which gas is circulated is formed between top cover 5 and wafer W as shown in FIG. 5.

When the circulation space of gas is formed, the supply of nitrogen gas from the gas supplying pipe 53 starts. As a result, the nitrogen gas flows toward the periphery from the center on the top surface of wafer W in the space. Herein, in FIG. 5, in order to easily explain the flow of the gas or chemical liquid, a height-direction dimension from the top surface of guide plate 21 to the bottom surface of protrusion 51 is enlarged and shown. Further, in FIGS. 5 and 6, the flow of the gas is indicated by a dashed arrow and the flow of the liquid is indicated by a solid arrow.

As described above, by moving down top cover 5, when top cover 5 is placed at the processing position in parallel with the operation of supplying gas to the inside of the space formed between top cover 5 and wafer W, the supply of the HF solution from opening 241 of lifter 24 to the bottom surface of wafer W starts. Further, guide plate 21, enclosing member 3, and inner cup 41 that are connected to each other are accelerated up to, for example, a predetermined rotational speed in the range of 1000 rpm to 1500 rpm by operating rotation shaft 22, together with the supplying operation. As a result, wafer W held on holding unit 31 rotates at the same speed as the rotational unit (guide plate 21 or enclosing member 3 serves as a part thereof).

These operations cause the HF solution supplied to the bottom surface of wafer W to receive centrifugal force from guide plate 21 or wafer W that rotate to fill up the space formed between the bottom surface of wafer W and the top surface of guide plate 21 to be dispersed throughout the entire space. As a result, the HF solution flows on the bottom surface of wafer W to reach the periphery of wafer W and is discharged to the outside through a space of which upper part and lower part are blocked by enclosing member 3 and guide plate 21.

Further, the HF solution is discharged to the inside of outer cup 42 through the gap between inner cup 41 and guide plate 21 with the current of the gas that flows on the top surface of enclosing member 3. Therefore, the HF solution that enters outer cup 42 is discharged toward discharge path 421.

In the liquid processing in which the HF solution is supplied to the bottom surface of wafer W, the supply state of the HF solution on the periphery of wafer W is shown in enlarged views in FIGS. 6 and 7. As indicated by the solid arrow in FIGS. 6 and 7, guide grooves 32 are formed on the bottom surface of enclosing member 3 placed on the outer periphery side of wafer W, and as a result, the HF solution that enters into the gap between the outer peripheral surface of wafer W and the inner peripheral surface of enclosing member 3 is drawn out by each guide groove 32. Therefore, the amount of the HF solution that exists in the vicinity of the gap is reduced, such that the amount of the HF solution going around and flowing onto the top surface of wafer W is decreased.

Meanwhile, even though guide grooves 32 are formed, as the capillary action works even on the gap, a small amount of chemical flows into the gap, and as a result, the HF solution contacts the peripheral side surface of wafer W to remove an undesired film of the contacted region.

As described above, when the liquid processing is performed for a predetermined time by supplying the HF solution to the bottom surface and the peripheral side surface of wafer W while suppressing the amount of the HF solution that goes around and flows onto the top surface of wafer W, rinse cleaning of wafer W is performed by changing the processing liquid supplied through opening 241 from the HF solution to the DIW while rotating wafer W. Thereafter, wafer W is continuously rotated while stopping the supply of the processing liquid supplied to the bottom surface of wafer W and drying is performed. The rotating of wafer W is then stopped and the processing operation of wafer W by liquid processing apparatus 1 is completed.

In addition, the liquid processing by liquid processing apparatus 1 is completed by delivering wafer W to the external wafer transporting mechanism through a reverse operation of the carry-in operation.

Liquid processing apparatus 1 according to the exemplary embodiment of the present disclosure achieves the following effects. Enclosing member 3 is installed around wafer W that rotates while being supported horizontally and each of guide grooves 32 that elongates outwards from the inner periphery of enclosing member 3 is formed on the bottom surface thereof to exert the capillary action to the HF solution that reaches the periphery of wafer W to be drawn out. Therefore, the chemical liquid is prevented from going around and flowing onto the top surface of wafer W to achieve an excellent processing result.

Herein, planar shapes of guide grooves 32 are not limited to the planar shape of guide grooves 32 which elongates straightforwardly outward from the center of wafer W as shown in FIG. 4. For example, guide grooves 32 may be inclined with respect to the diameter direction along the rotational direction of wafer W (enclosing member 3). According to the above configuration, since guide grooves 32 elongate in a direction in which the centrifugal force acts on the HF solution that is drawn out by the capillary phenomenon, the HF solution can be more effectively discharged.

Further, holding unit 31 is not only installed in enclosing member 3 but also may be installed, for example, on the top surface of guide plate 21 in the circumferential direction of wafer W.

Figure 8:
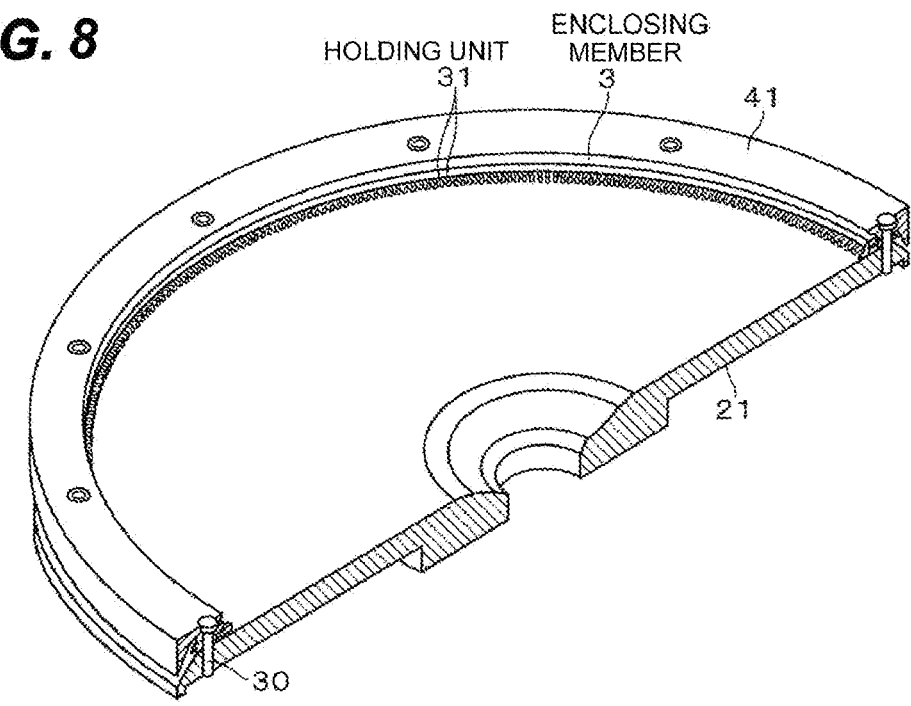
FIG. 8 is a longitudinal cross-sectional perspective view showing a configuration composed of a guide plate, an enclosing member, and an inner cup according to a second exemplary embodiment.
Figure 9:
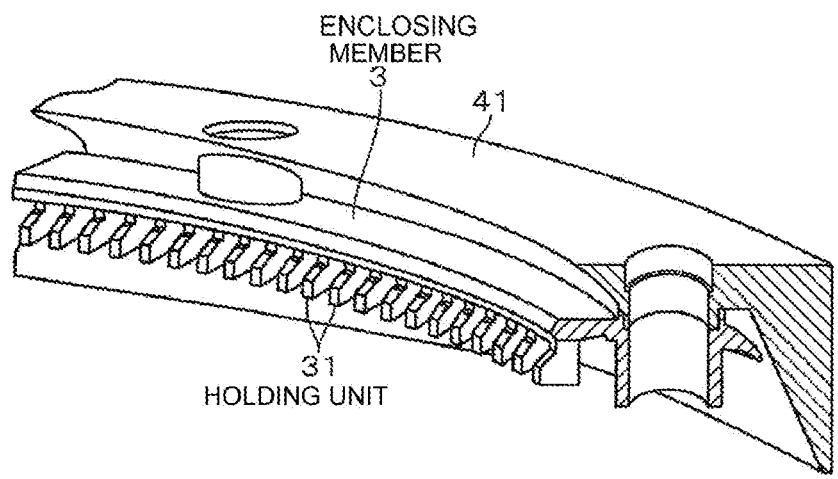
FIG. 9 is an enlarged perspective view illustrating a configuration of a holding unit installed in the enclosing member according to the second exemplary embodiment.

Subsequently, the configuration of liquid processing apparatus 1 according to a second exemplary embodiment will be described. As shown in FIGS. 8 and 9, liquid processing apparatus 1 according to the second exemplary embodiment is different from liquid processing apparatus 1 according to the first exemplary embodiment, in that a plurality of holding elements 31 holding wafer W are installed to make a distance between adjacent holding elements 31 narrow, such that the chemical liquid is prevented from going around and flowing onto the top surface of wafer W.

Herein, since the configuration and operation of wafer holding unit 2, inner cup 41 or outer cup 42, top cover 5, the elevating mechanism, case 11, or airstream inflow unit 14 in liquid processing apparatus 1 according to the second exemplary embodiment are the same as those described with reference to FIGS. 1 and 5, a duplicated description will be omitted. Further, in each of FIGS. 8 to 11, the same reference numerals as those shown in FIGS. 1 to 7 refer to the same components as liquid processing apparatus 1 described in the first exemplary embodiment.

FIGS. 8 and 9 are perspective views showing configurations of enclosing member 3 and inner cup 41 installed in liquid processing apparatus 1 according to the second exemplary embodiment. 360 holding elements 31 having a small piece shape that protrude toward the diameter-direction inside from the bottom surface of enclosing member 3 are formed in enclosing member 3 shown in FIGS. 8 and 9 and holding elements 31 are arranged at an interval of 1°.

Each holding unit 31 is the same as holding unit 31 according to the first exemplary embodiment shown in FIGS. 2 to 4, in that each holding unit 31 holds the periphery of wafer W from the bottom surface thereof to hold wafer W while the gap is formed for dispersing the processing liquid between the top surface of guide plate 21 and the bottom surface of wafer W.

Figure 10:
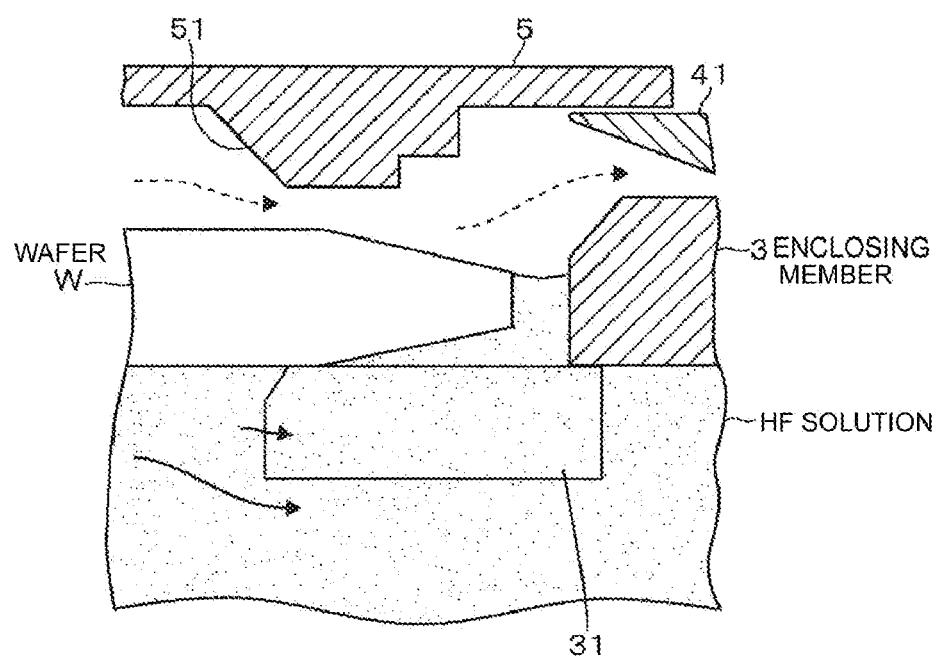
FIG. 10 is a first explanatory diagram illustrating an action of preventing a chemical liquid from going around and flowing onto the top surface by the holding unit according to the second exemplary embodiment.

As shown in FIG. 10, a holding surface of each holding unit 31 of the exemplary embodiment, which contacts wafer W installed on the top surface side, is planarized and the holding surface holds the edge of the bottom surface of wafer W on the holding surface.

In liquid processing apparatus 1 according to the second exemplary embodiment, a distance ($D_2'$ shown in FIG. 11) between the holding surfaces of adjacent holding elements 31 is set to the range of 0.5 mm to 10 mm and more preferably to the range of 0.5 mm to 3 mm. As seen in an experimental result to be described below, the amount of the chemical liquid that goes around and flows onto the top surface is reduced in a region where holding elements 31 are installed and the amount of the liquid chemical that goes around and flows onto the top surface may be reduced even in a region sandwiched by adjacent holding elements 31 through making the gap between the arranged holding elements 31 to be narrowed. The present disclosure is implemented based on such fact as described above.

The reason why the amount of the chemical liquid goes around and flows onto the top surface is reduced through making the distance between the holding surfaces of adjacent holding elements 31 narrow is not clear, but it may be considered that resistance is increased when the chemical liquid passes through the narrow flow passage, and as a result, the amount of the chemical liquid that enters the region is also decreased, such that the amount of the chemical liquid going around and flowing onto the top surface is reduced.

In acquiring the above-mentioned action, a width dimension ($T_1$ shown in FIG. 11) of the holding surface of holding unit 31 in the circumferential direction of wafer W is not limited to a specific range. However, when the width of holding unit 31 is excessively large, the chemical liquid is difficult to enter the gap between the outer peripheral surface of wafer W and the inner peripheral surface of enclosing member 3. As a result, in respect of widely dispersing the chemical liquid onto the peripheral side surface of wafer W while preventing the chemical liquid from rounding, width dimension $T_1$ is preferably set to the range of 0.1 mm to 3 mm and more preferably to the range of 0.5 mm to 2.0 mm.

A detailed example of $T_1$ and $D_2'$ according to the exemplary embodiment will be described. The length of the periphery of wafer W having a diameter of 300 mm held by the holding surface of holding unit 31 is 942.5 mm. When 360 holding elements 31 are arranged at an interval of 1° through setting up width dimension $T_1$ of each holding unit 31 to 1 mm, gap $D_2'$ between the holding surfaces of adjacent holding elements 31 is approximately 1.62 mm. Even the values of $T_1$ and $D_2'$ or the number of the arranged holding elements 31 able to supply the chemical liquid to the peripheral side surface of wafer W while preventing the chemical liquid from going around and flowing onto the top surface are set by using the experiment or fluid simulation.

An operation of liquid processing apparatus 1 according to the second exemplary embodiment, which has the above-mentioned configuration, will be described. The operations of carrying-in of wafer W, the supply operation of the HF solution and gas, and the condition such as the rotational speed of wafer W are the same as those in liquid processing apparatus 1 according to the first exemplary embodiment described with reference to FIG. 5.

Figure 11:
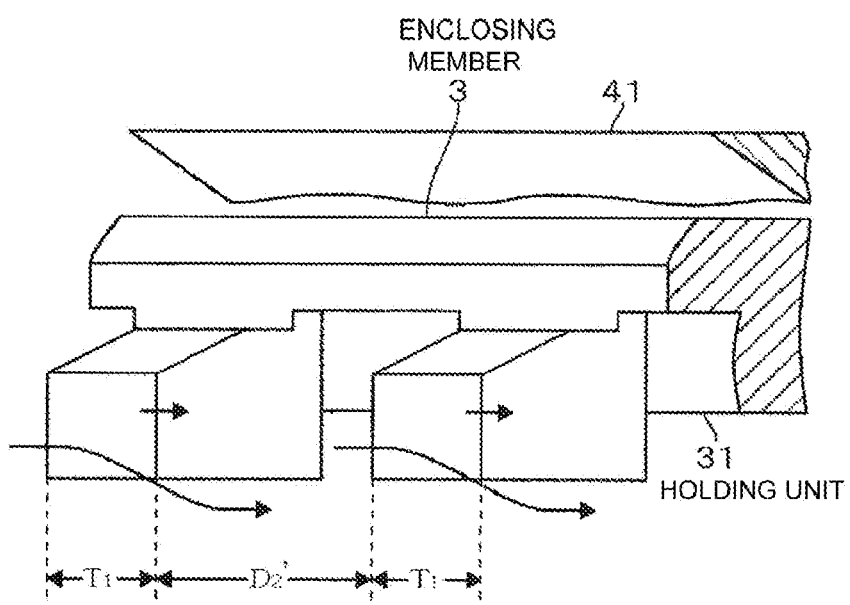
FIG. 11 is a second explanatory diagram illustrating an action of preventing a chemical liquid from rounding by the holding unit according to the second exemplary embodiment.

The HF solution supplied from opening 241 is dispersed to the inside of the space while filling up the space between the bottom surface of wafer W and the top surface of guide plate 21 is filled up to remove the undesired film formed on the bottom surface of wafer W. In addition, as shown in FIGS. 10 and 11, when the HF solution reaches the region where holding unit 31 is installed, the distance $D_2'$ between the adjacent holding elements 31 is small as the range of 0.5 mm to 10 mm, and as a result, it is difficult for the HF solution to flow into the gap.

Therefore, as indicated by a long solid arrow in FIGS. 10 and 11, most of the HF solution that reaches the region bypasses holding unit 31 to flow through a space below holding unit 31. Meanwhile, a small amount of HF solution may flow into the gap between adjacent holding elements 31 as indicated by a short solid arrow. As described above, as the amount of the HF solution supplied to the periphery of wafer W is decreased, the amount of the HF solution that goes around and flows onto the top surface of wafer W can be suppressed.

Since the rinse cleaning by the DIW after completing the liquid processing using the HF solution, or the operations of the drying after the rinse cleaning, and the carry-out process of wafer W are the same as those in liquid processing apparatus 1 of the first exemplary embodiment, a description thereof will be omitted.

Liquid processing apparatus 1 according to the second exemplary embodiment achieves the following effects. By setting the distance between the holding surfaces of adjacent holding elements 31 of wafer W that rotates while being horizontally held to 0.5 mm to 10 mm, it is difficult for the HF solution to pass between holding elements 31. As a result, the HF solution is prevented from going around and flowing onto the top surface of wafer W, so that an excellent processing result may be obtained.

Herein, holding unit 31 is not only installed on enclosing member 3 but also may be installed, for example, on the top surface of guide plate 21 in the circumferential direction of wafer W. Further, when holding unit 31 is installed on enclosing member 3, liquid processing apparatuses 1 of the first and second exemplary embodiments may be combined with each other by forming guide grooves 32 shown in FIG. 4 on the bottom surface of enclosing member 3. In this case, the action making it difficult for the HF solution to flow into the gap between holding elements 31 and the action making the HF solution to be drawn out by guide grooves 32 cooperate with each other to more effectively prevent the HF solution from going around and flowing onto the top surface of wafer W.

Further, as a modified example which is common to liquid processing apparatuses 1 according to the first and second exemplary embodiments, for example, top cover 5 and inner cup 41 or outer cup 42 are not indispensible components in liquid processing apparatus 1 according to the present disclosure and may be appropriately omitted, if necessary.

In addition, the type of a film to be removed or the processing liquid is not limited to the above-described example and other films such as a Cu film may be removed by other corrosive chemical liquid such as dilute HCl. Further, even the type of the processing liquid is not limited to a case of using the corrosive chemical liquid such as the removal of the film formed on the bottom surface of wafer W, and, for example, in the liquid processing apparatus that performs the rinse cleaning using the DIW, the chemical liquid may be prevented from going around and flowing onto the top surface by the technique according to each of the exemplary embodiments described above.

EXAMPLE (Experiment)

A range of the top surface of a wafer W that rotates onto which a chemical liquid goes around and flows was measured by using a liquid processing apparatus 1 according to a second exemplary embodiment and by performing liquid processing through changing the number of holding elements 31 installed on an enclosing member 3. A silicon wafer with an oxide film was used as wafer W and the oxide film was removed with an HF solution of 49 wt % to observe the range of the top surface of a wafer W in which the oxide film was removed. Further, in an example to be described below, a rotational speed of wafer W and a flow rate of the supplied chemical liquid are equivalent to those in Comparative Example.

A. Experimental Condition (Example)

360 holding elements 31 having a width dimension $T_1$ of 1.0 mm were arranged at an interval of 1° when viewed from the center of wafer W. A distance $D_2'$ between adjacent holding elements 31 is 1.6 mm.

(Comparative Example)

12 holding elements 31 having a width dimension $T_1$ of 1.0 mm were arranged at an interval of 30° when viewed from the center of wafer W. A distance $D_2'$ between the holding surfaces of adjacent holding elements 31 is 77.5 mm.

B. Experimental Result

Figure 12A:
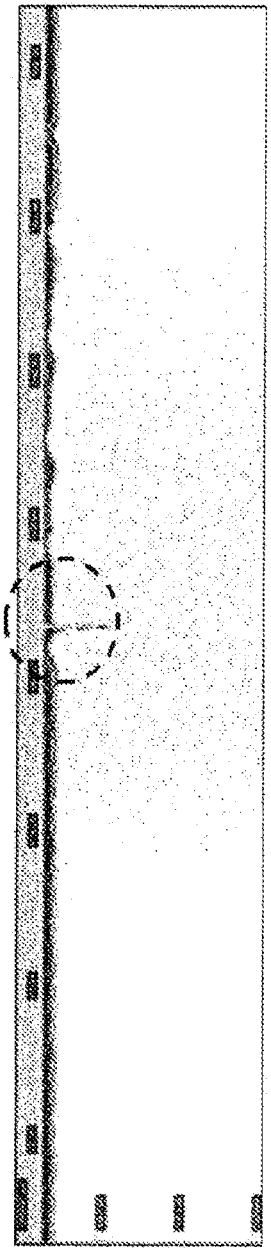
FIG. 12 is an explanatory diagram illustrating an etching state of a periphery of a wafer according to an exemplary embodiment.
Figure 12B:
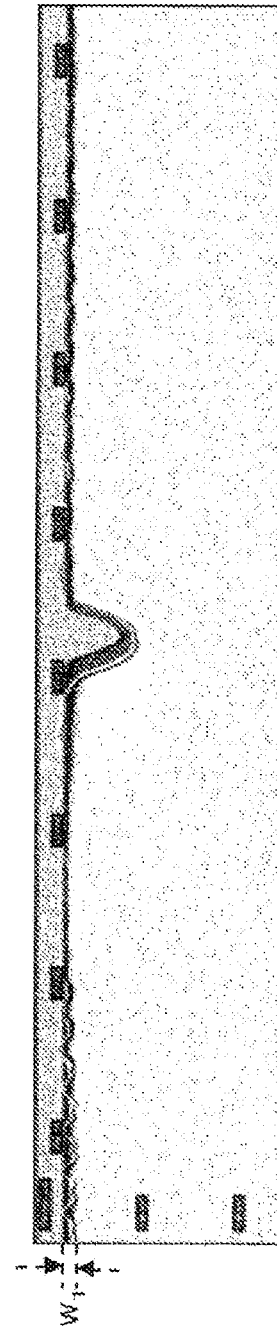
Figure 13A:
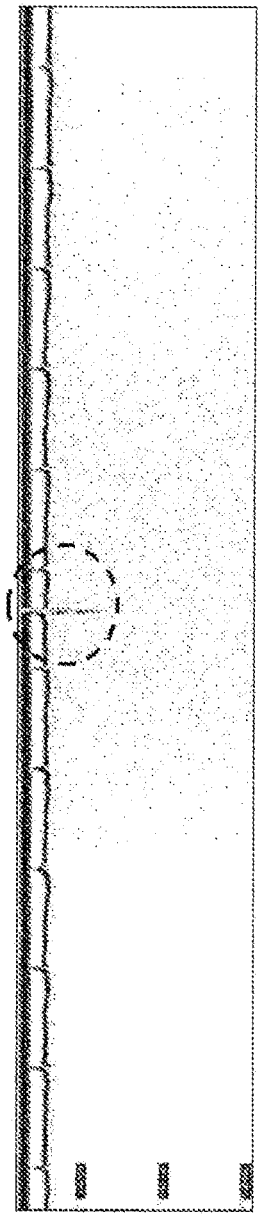
FIG. 13 is an explanatory diagram illustrating an etching state of a periphery of a wafer according to a comparative example.
Figure 13B:
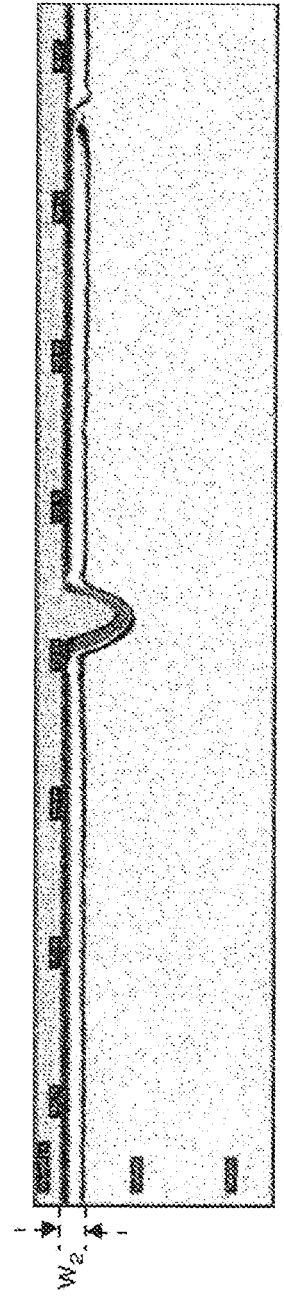

The experimental result according to the Example is shown in FIGS. 12A and 12B, and the experimental result according to the Comparative Example is shown in FIGS. 13A and 13B. In FIGS. 12 and 13, in the periphery of wafer W, a diagram displaying an etching depth of a silicon oxide film by the HF solution with colors for every range of the etching depth is converted into a gray scale. An abscissa of each figure represents a circumferential-direction position of wafer W and an ordinate represents a diameter-direction position of wafer W. In the ordinate, an upper side of the ordinate corresponds to an outer periphery of wafer W.

Further, FIGS. 12A and 13A show an etching state of an entire circumference of wafer W and a region surrounded by a dashed circle in the figures is shown in enlarged views in FIGS. 12B and 13B. A black line that elongates horizontally at the upper side of the ordinate represents an outer peripheral end of wafer W, and similarly, a black line that elongates horizontally at the lower side of the ordinate represents a region having the least shallow etching depth, that is, the position which the HF solution going around and flowing onto the top surface of wafer W reaches. In the figures, a region where the outer peripheral end of wafer W is displayed as large concave portion is a notch.

When observing the result of the Example shown in FIGS. 12A and 12B, as can be seen remarkably in the enlarged diagram of FIG. 12B, the region where the HF solution is reached and the oxide film is etched illustrates a minute wave in the circumferential direction of wafer W while entering inside of wafer W from the outer peripheral end thereof or stopping in the vicinity of the outer peripheral end.

When a correspondence relationship between a distance (hereinafter, referred to as a detour distance) to a position which the HF solution reached from the outer peripheral end of wafer W and a placement position of holding unit 31 was verified, the detour distance was small at a position where holding unit 31 was installed. In contrast, in a region sandwiched by adjacent holding elements 31, the detour distance was so large that the HF solution entered up to the inside of wafer W. A detour distance $W_{1MAX}$ at a position where the HF solution goes around and flows onto the most inner side was approximately 0.5 mm. Meanwhile, except for a notch position, an average value $W_{1AVE}$ of the detour distance throughout wafer W in the circumferential direction was approximately 0.4 mm.

With respect to this, in the experimental result according to the Comparative Example in which the number of holding elements 31 was small, a detour distance was intermittently small to correspond to the position where holding unit 31 was installed, as can be seen in FIG. 13A. Meanwhile, the HF solution uniformly goes around and flows onto the space between adjacent holding elements 31. In addition, the maximum value $W_{2MAX}$ of the detour distance was approximately 1.0 mm and the average value $W_{2AVE}$ was approximately 0.7 mm, such that any detour distance value is large than that of the Example.

From a comparison result of the experiments of the Example and the Comparative Example, since the detour distance could be reduced by increasing the number of installed holding elements 31 holding wafer W, the amount of the HF solution that goes around and flows onto the top surface could be reduced. In addition, when the value of $D_2{'}$ is approximately 10 mm or less, the value of the maximum detour distance $W_{MAX}$ can be smaller than $W_{2MAX}$ of (Comparative Example). Further, when the value of $D_2{'}$ is approximately 0.5 mm or more, the HF solution can be prevented from going around and flowing onto the top surface while the HF solution is widely dispersed to the peripheral side surface of wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a rotational unit configured to rotate a substrate to be processed while the substrate to be processed is being held horizontally; and
   a processing liquid supplying unit configured to supply a processing liquid to the bottom surface of the substrate to be processed which is rotating without supplying the processing liquid to the top surface thereof,
   wherein the rotational unit includes an enclosing member fixed to the rotational unit and configured to rotate with the substrate to be processed while surrounding the periphery of the substrate to be processed,
   the enclosing member includes a portion extended in a horizontal direction and is configured such that a gap is formed between the inner periphery of the enclosing member and the periphery of the substrate to be processed when the substrate to be processed is disposed on the rotational unit,
   the enclosing member includes a plurality of guide grooves formed on the bottom surface of the portion extended in the horizontal direction and configured to draw out the processing liquid being entered into the gap outwardly by a capillary action to prevent the processing liquid from going around and flowing onto the top surface of the substrate to be processed, and
   each of the plurality of guide grooves is configured to elongate outwardly from the inner periphery of the portion extended in the horizontal direction and is arranged with an interval from each other in the circumferential direction of the enclosing member.

2. The apparatus of claim 1, wherein a plurality of holding elements are formed in the rotational unit with a gap from each other in the circumferential direction of the substrate to be processed in order to hold the periphery of the substrate to be processed from the bottom surface thereof.

3. The apparatus of claim 2, wherein the plurality of holding elements are formed in the enclosing member.

4. The apparatus of claim 1, wherein a width dimension of each guide groove in the circumferential direction of the enclosing member is in the range of 0.1 mm to 5 mm.

5. The apparatus of claim 1, wherein a gap between the adjacent guide grooves is in the range of 0.5 mm to 10 mm.

6. The apparatus of claim 1, wherein a gas supplying unit is provided at an upper side of the center of the substrate to be processed.

7. A liquid processing apparatus, comprising:
   a rotational unit configured to rotate a substrate to be processed while the substrate to be processed is being held horizontally; and
   a processing liquid supplying unit configured to supply a processing liquid to the bottom surface of the substrate to be processed which is rotating without supplying the processing liquid to the top surface thereof,
   wherein the rotational unit includes a plurality of holding elements installed with an interval from each other in the circumferential direction of the periphery of the substrate to be processed to hold the substrate to be processed from the bottom surface thereof, and an enclosing member fixed to the rotational unit and configured to rotate with the substrate to be processed while surrounding the periphery of the substrate to be processed, the enclosing member includes a portion extended in a horizontal direction where the plurality of holding elements are provided and is configured such that a gap is formed between the inner periphery of the enclosing member and the periphery of the substrate to be processed when the substrate to be processed is disposed on the rotational unit, with a plurality of grooves formed on the bottom surface of the portion extended in a horizontal direction and configured so that when processing liquid is entered into the gap, it will be drawn outwardly by a capillary action in order to guide the processing liquid on the bottom surface thereof and prevented from flowing onto the top surface of the substrate to be processed, and a distance between adjacent holding elements is in the range of 0.5 mm to 10 mm.

8. The apparatus of claim 7, wherein a width dimension of a holding surface of each holding element, which holds the substrate to be processed, in the circumferential direction of the substrate to be processed is in the range of 0.1 mm to 3 mm.

* * * * *